United States Patent
Arz et al.

(10) Patent No.: US 6,297,635 B1
(45) Date of Patent: Oct. 2, 2001

(54) SWITCHABLE GRADIENT COIL ARRANGEMENT

(75) Inventors: Winfried Arz; Matthias Gebhardt; Franz Schmitt, all of Erlangen; Johann Schuster, Oberasbach, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/436,602

(22) Filed: Nov. 9, 1999

(30) Foreign Application Priority Data

Nov. 9, 1998 (DE) .............................................. 198 51 584

(51) Int. Cl.[7] .............................................. G01V 3/00
(52) U.S. Cl. .............................................. 324/318; 324/322
(58) Field of Search .............................................. 324/318, 322, 324/321, 300, 306, 307, 309

(56) References Cited

U.S. PATENT DOCUMENTS

| 5,289,129 | * 2/1994 | Joseph | 324/318 |
| 5,311,135 | 5/1994 | Vavrek et al. | 324/318 |
| 5,334,937 | * 8/1994 | Peck et al. | 324/318 |
| 5,349,318 | 9/1994 | Inoue | 324/318 |
| 5,406,205 | * 4/1995 | Muller | 324/318 |
| 5,736,858 | 4/1998 | Katznelson et al. | 324/318 |

FOREIGN PATENT DOCUMENTS

| 2 315 555 | 2/1998 | (GB) . |
| WO 00/00841 | 1/2000 | (WO) . |

* cited by examiner

Primary Examiner—Louis Arana
(74) Attorney, Agent, or Firm—Schiff Hardin & Waite

(57) ABSTRACT

A gradient coil arrangement for a nuclear magnetic resonance tomography apparatus contains windings arranged in a primary winding plane as well as further windings arranged in a secondary winding plane. The primary and the secondary winding planes are radially spaced from each other thereby have a radial spacing. At an end face of the gradient coil arrangement, the windings have a number of open (free) conductor ends, and connector elements connect conductor ends in the primary winding plane to conductor ends in the secondary winding plane and/or connect conductor ends within one of the winding planes to one another. The connector elements are switchably fashioned for forming gradient coil arrangements having different field qualities/performance features.

10 Claims, 5 Drawing Sheets

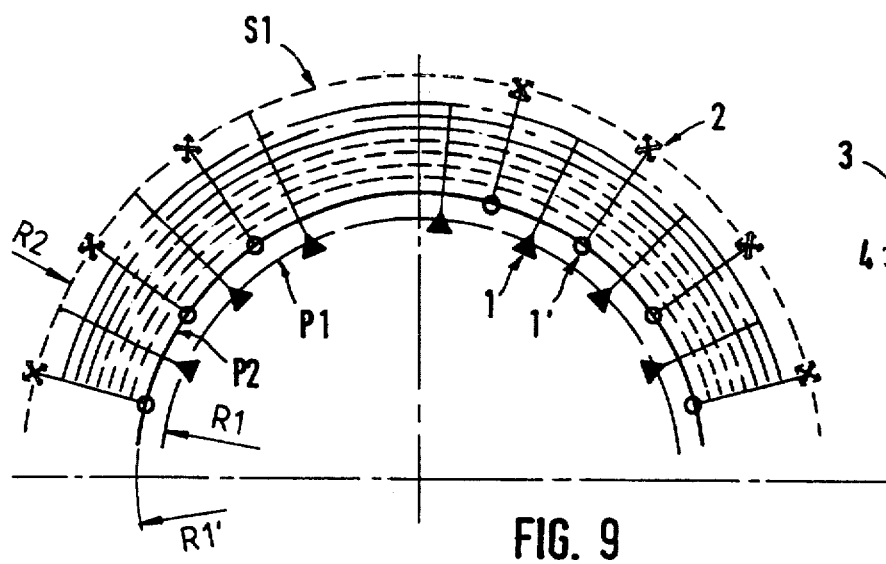
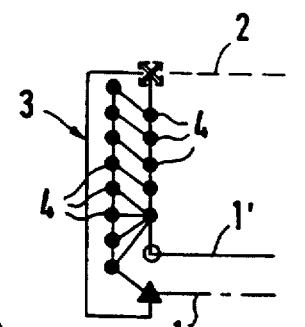
FIG. 9
FIG. 10
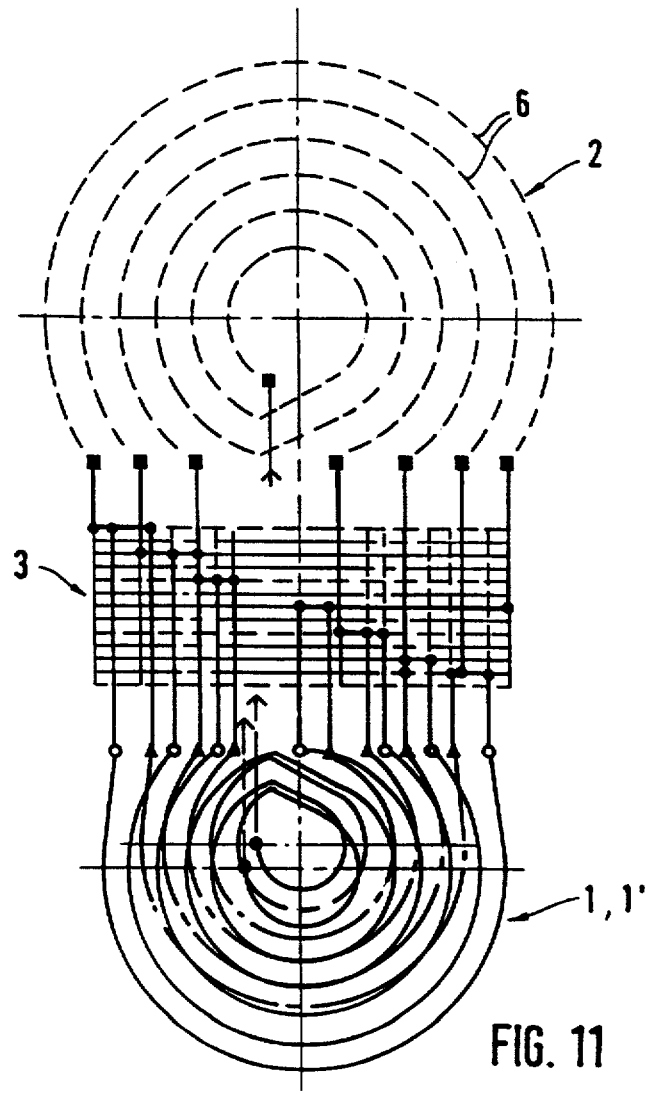
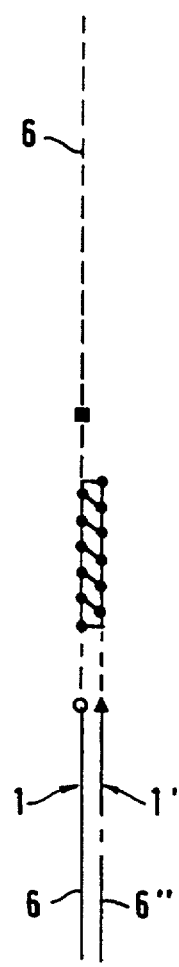
FIG. 11
FIG. 12

SWITCHABLE GRADIENT COIL ARRANGEMENT

BACKGROUND OF THE INVENTION

1. Field of the Invention

The present invention is directed to a gradient coil arrangement for a magnetic resonance tomography apparatus, for generating transverse or longitudinal gradient fields.

2. Description of the Prior Art

The required performance capability of a gradient coil is essentially dependent on the type of MR imaging. Conventional MR imaging usually requires a good linearity volume (−5% in the linearity volume of 40–50 cm) with moderate gradient strength (10–20 mT/m) and switching times (−1 ms). For fast MR imaging, high amplitude gradients (20–40 mT/m) are switched very fast (100–500 μs). As a result, side affects in the form of peripheral muscle stimulations can occur. In order to avoid these effects, the linearity volume of the gradient coils is generally reduced, which leads to a reduction of the maximum field boosts, and thus also leads to a reduction of the stimulation risk (the maximum field boost, in addition to other aspects, determines the stimulation risk). Given rapidly switched gradient coils, the linearity volume can thus diminish very quickly from, typically, 40–50 cm to 20 cm DSV. A coil having such properties is usually not suited for conventional whole-body applications, but is suitable for fast MR imaging techniques such as EP, RARE, HASTE, GRASE, etc. The speed is the important advantage.

Another reason for different field qualities is that the linearity generally decreases with the distance from the center when a gradient coil is designed for a specific volume. The human body, however, does not necessarily follow this rule. For example, the shoulders are located in this region. Given exposures of the spinal column, it is often meaningful to image the entire spinal column without repositioning. Dependent on the positioning of the center, the cervical and/or lumbar vertebra lie in the region of the greatest non-linearities. Image distortions are therefore unavoidable. Due to the smaller diameter of the coil, there is a smaller homogeneity volume for head gradient coils. This only allows the imaging of parts of the brain but not the imaging of the cervical spinal column. Therefore it can be desirable for the radiologist to switch from a central FOV to a displaced FOV. This, however, has not been hitherto possible. Only embodiments of the one or other type exist.

In order to avoid defining the field quality that the gradient coil arrangement should have at the time of manufacture which would result in an inflexible system unable to meet the differing needs of various customers, a magnetic resonance imaging system is disclosed in German OS 195 40 746 wherein a modular gradient system is employed, which combines a conventional and a fast gradient coil system in one coil body. The conventional gradient system has a large linearity volume that, however, can only be slowly switched and, moreover, only allows medium gradient amplitudes. The fast gradient system, by contrast, exhibits a smaller linearity volume but instead allows faster switching of very high gradient amplitudes. Fundamentally, however, this is nothing more than the combination of two completely separate gradient coil systems that are merely wound on the one and the same tubular carrier, with a series connection or parallel connections also being possible in addition to the separate drive of these gradient coil systems.

U.S. Pat. No. 5,349,318 discloses a gradient coil arrangement wherein conductors of the gradient coil are arranged essentially in a primary plane, which is an inner cylindrical envelope, and in a secondary plane, which is an outer cylindrical envelope which concentrically surrounds the inner cylindrical envelope. Each conductor arrangement of the respective two cylindrical envelopes contains a sub-coil having a helical conductor arrangement as well as a number of sub-coils having a horseshoe-shaped conductor arrangement. The open conductor ends of the sub-coils are firmly connected to one another, via conductive connecting wires, at an end side between the two cylindrical envelopes, the connecting wires being, for example, soldered to the coil conductor ends. The field quality of the gradient coil arrangement is thus also defined and is invariable.

SUMMARY OF THE INVENTION

An object of the present invention is to provide a gradient coil arrangement that makes it possible—dependent on the application—to modify the performance features or field qualities of the gradient coil in a broad range at the installation site in order to be able to optimally adapt the imaging properties to the respectively desired type of examination, without requiring a multitude of coils in the coil body.

This object is inventively achieved in a gradient coil arrangement having windings, arranged in a primary plane (as used herein "plane" means winding plane, which need not necessarily be flat, and in fact in actual usage will be a semi-cylindrical curved surface), further windings arranged in a secondary plane, the primary and the secondary planes being radial spaced from each other, the windings having a number of open (free) conductor ends at an end face of the gradient coil arrangement, connector elements that connect conductor ends of the primary plane to conductor ends of the secondary plane and/or conductor ends within one of the planes to one another, and the connector elements being switchable for forming gradient coil arrangements having different field qualities/performance features.

The selectable performance features are linearity, linearity volume, shielding inductance, noise (disturbance factors), stimulation sensitivity, maximum gradient strength, maximum slew rate, and symmetry/asymmetry.

The inventive gradient coil, which not only significantly decreases the coil volume since the number of coils for meeting different examination requirements is reduced, and as a result partially competing and/or disturbing sub-coil properties are avoided and the cost is reduced.

The inventive gradient coil arrangement is composed, for example, of a region that contains windings (coil turns) as well as another region that contains the open conductor ends in the return conductor area, these open conductor ends being connected to one another by connector elements. Because the connector elements are switchably designed, versatile different interconnections of the open conductor ends to one another are enabled, so that complete, different coil configurations having different field qualities or performance features can be formed without a separate coil with separate windings being required for this purpose.

It has proven expedient to arrange switchable connector elements at both end faces and, possibly, in the inside of the coil as well, in order to be able to create an entire series of functionally different gradient coil arrangements in an especially versatile way from the predetermined windings of the gradient coils, on the basis of correspondingly different interconnections of these windings with one another.

In a further embodiment switchable connector elements are integrated in the coil containing region and, thus, this region can also be functionally modified in reversible fashion according to the customers wishes on the basis of a correspondingly modified drive.

In an embodiment of the invention, the desired performance features can be statically determined before execution of a pulse (scanning) sequence and the connector elements can be subsequently switched as needed. In another embodiment, the connector elements can be fashioned to be dynamically switchable in a program-controlled manner, i.e. during the execution of a sequence.

The coils can thereby be interconnected to produce a shielded or non-shielded gradient coil arrangement. Moreover, the longitudinal (z-direction) halves of the windings can be asymmetrically interconnected. Thus, for example, the front half (+z) can have different field properties than the back half (−z) of the gradient coil arrangement. A displacement of the homogeneity volume is thereby possible.

DESCRIPTION OF THE DRAWINGS

FIG. 9 shows a partial end view of a switchable 3D coil having three sets of saddle coils in accordance with the invention.

FIG. 10 is a side view of the interconnection unit of FIG. 9.

FIG. 11 is an "unfolded," open illustration of the coil sets of FIG. 9.

FIG. 12 is a side view of the winding and interconnection pattern according to FIG. 11.

DESCRIPTION OF THE PREFERRED EMBODIMENTS

Figure 1:
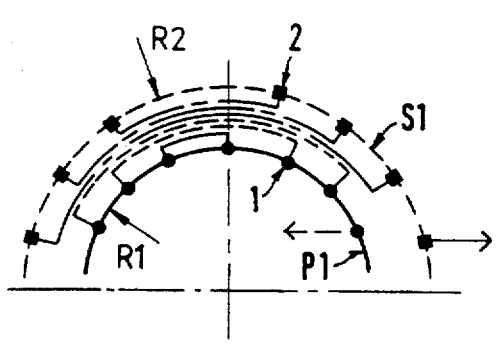
FIG. 1 a partial end view of a switchable 3D coil composed of a saddle coil set having a smaller diameter R1 and a saddle coil set having a larger diameter R2 in accordance with the invention.
Figure 2:
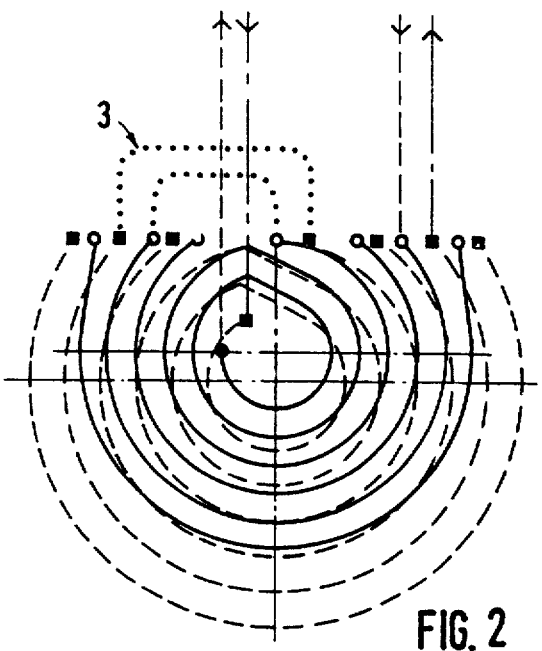
FIGS. 2 through 4 respectively show different interconnections of the windings of each plane of the 3D coil of FIG. 1 to one another.
Figure 3:
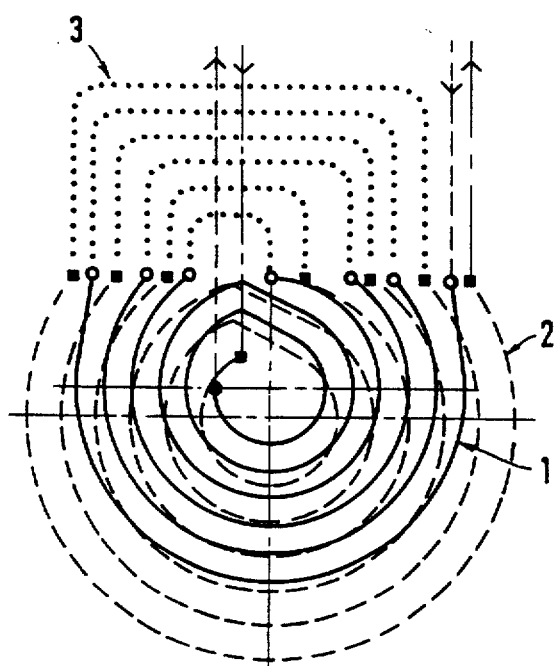
Figure 4:
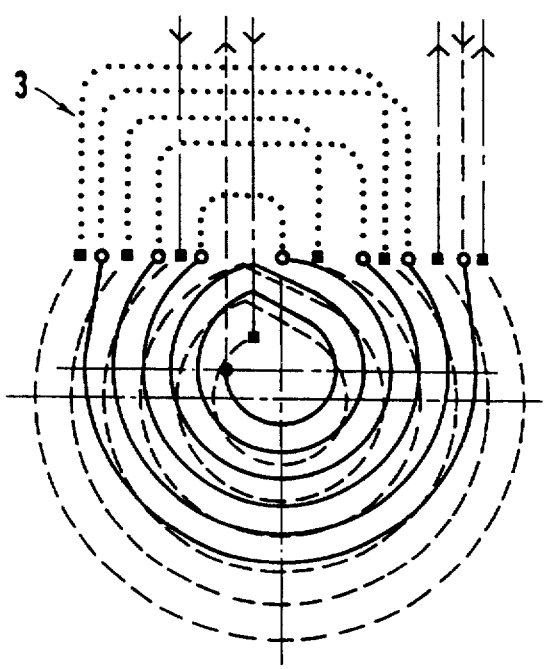
Figure 5:
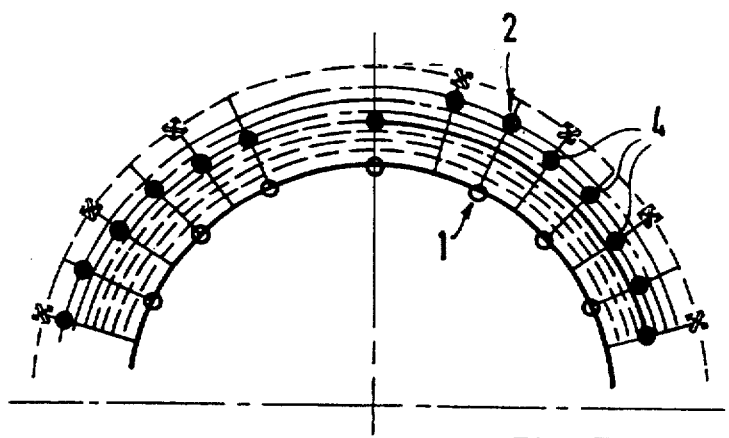
FIG. 5 schematically shows a partial face view of an inventive coil arrangement wherein, due to the interconnections, windings of one plane are connected to the other plane to form a 3D coil.
Figure 6:
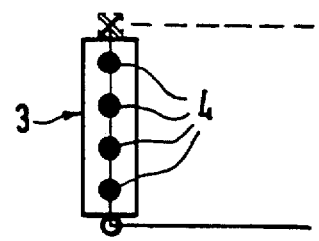
FIG. 6 is a schematic, radial section in the region of the end face of the coil arrangement of FIG. 5.
Figure 7:
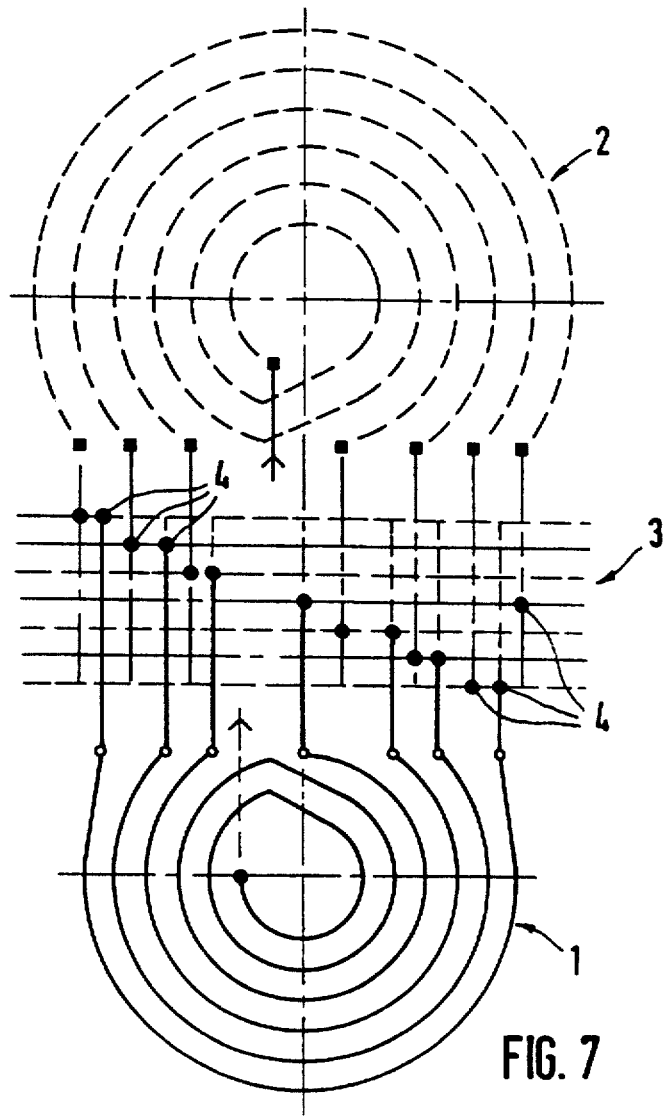
FIG. 7 is an "unfolded," open illustration of the coils of the primary and secondary planes with a network-like interconnections of the windings to one another in accordance with the invention.
Figure 8:
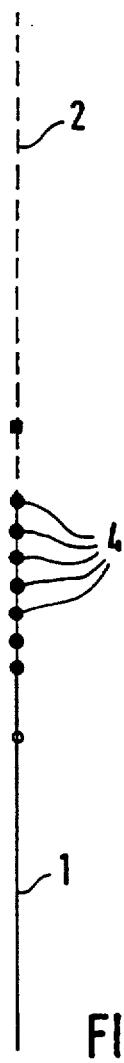
FIG. 8 is a side view of the winding pattern and the interconnections according to FIG. 7.

FIG. 1 shows a switchable 3D coil composed of a coil set 1 in a primary plane P1 having a smaller diameter R1 and a coil set 2 in a secondary plane S1 having a larger diameter R2. In the illustrated exemplary embodiment, the windings of the coil sets 1 and 2 are open (free) at one side and are not connected to one another, i.e. there is no connection between the inner primary plane P1 and the outer secondary plane S1. FIGS. 2 through 4 show different types of connections of the open winding ends to one another. The interconnection is implemented in the arrangement of FIG. 2 so that only some of the windings of the primary plane P1 and some of the windings of the secondary plane S1 are connected to one another. The interconnection shown in FIG. 3 shown with dotted lines results in all windings being connected in series. As a shielded arrangement, the complete coil or individual windings of the coil set 1 can be a primary coil and of the coil set 2 can be a secondary coil (opposite current flow), however, an unshielded operation with isodirectional current flow is also possible.

In the arrangement of FIG. 4, the interconnection is made such that some of the windings are connected series and others are connected in parallel.

In the exemplary embodiment of FIGS. 5 through 8, the open ends of the windings of the coil set 1 in the primary plane P1 are connected to the open ends of the windings of the coil set 2 in the secondary plane S1 by a network-like interconnection device 7. The shown interconnection corresponds to a standard, actively shielded 3D coil, but all combinations of the conductor interconnection can be implemented, i.e. serial, parallel, partial, etc. The specific interconnection is thereby not shown in detail; the network 3 of the interconnection device 7 is merely indicated, by the respective linkage points 4 of the network 3. The linkage points 4 connecting the open ends of the windings are, for example, switchable electronic elements, which are in a connecting state. The shown interconnections are changeable, for example, during an examination of a subject with this gradient coil arrangement. For this purpose, a control unit 8 is connected to the interconnection device 7 for changing the states of the respective switchable elements. This can be undertaken using a control program, for example.

FIGS. 9 through 12 schematically show a switchable 3D coil composed of three coil sets 1, 1' and 2 fashioned as saddle coils that are respectively oriented in the primary planes P1, P2 and the secondary plane S1 with different diameters R1, R1' and R2. For example, two coils can generate the gradient field—with the individual coil set field characteristics being superimposed—and the third coil set can generate the shielding field. Again, the network 3 with the linkage points 4 is only schematically shown, rather than a detailed structure of the actual switched connection.

Figure 13:
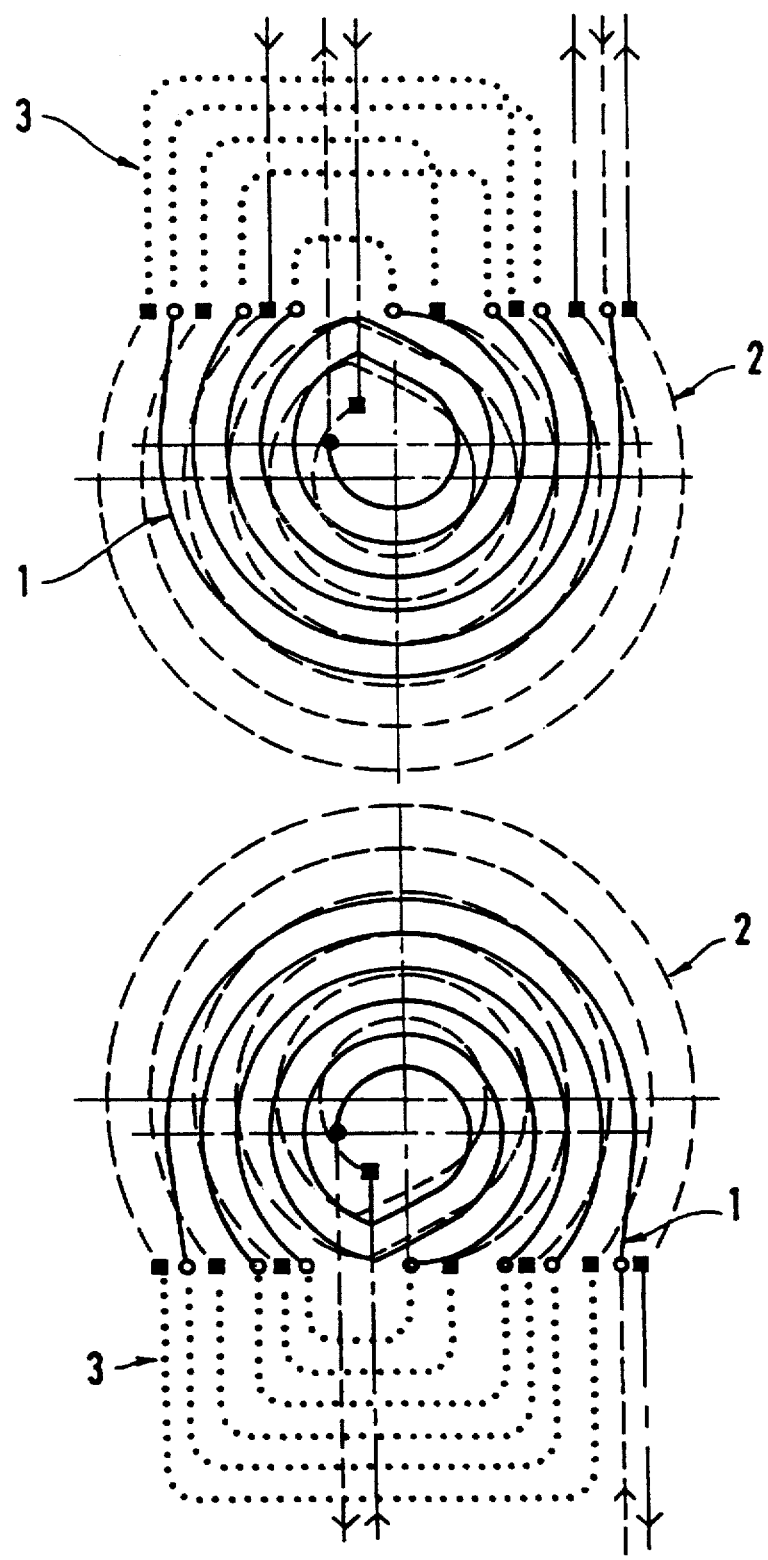
FIG. 13 shows a switchable 3D coil with asymmetrically configured coil halves in accordance with the invention.

FIG. 13 likewise shows a switchable 3D coil, wherein the coil halves—deviating from the normally axially symmetrical design—are asymmetrically configured, i.e. respectively different, i.e. asymmetric coil arrangements and produced due to different interconnections of the windings that are themselves symmetrically arranged in the two coil halves. The windings of the coil set 1 of the primary plane P1 are shown with solid lines and the windings of the coil set 2 in the secondary plane S1 are shown with broken lines, with the network 3 for the interconnection.

Figure 14:
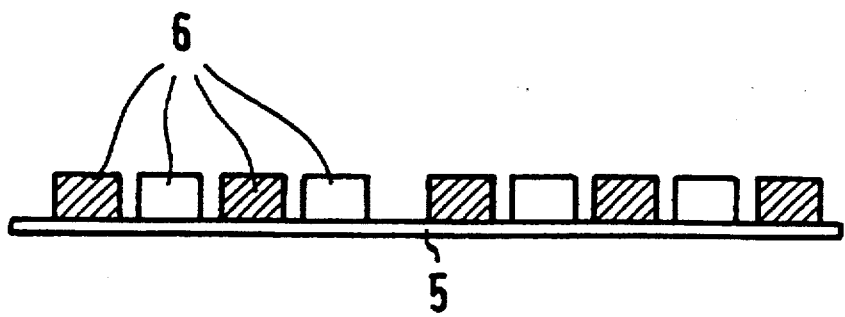
FIGS. 14 through 16 respectively schematically illustrate different versions of switchable coil sets in accordance with the invention.
Figure 15:
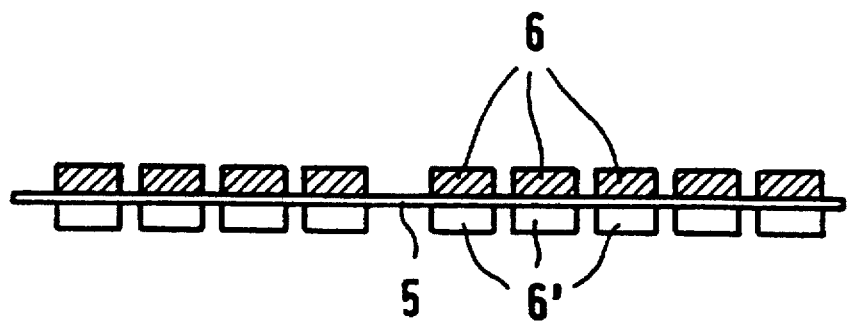
Figure 16:
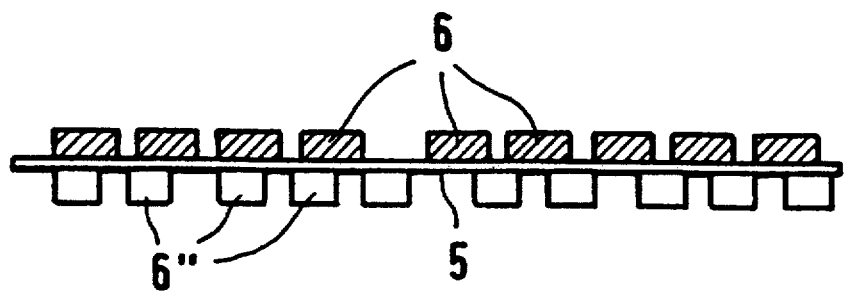

FIGS. 14 through 16 show versions for realizing switchable saddle coil sets. The illustrations apply to the primary as well as to the secondary coils, i.e. for the coil sets referenced 1 and 2 above.

In FIG. 14, the switchable windings or winding groups 6 lie in a plane on an insulating carrier 5. This structure has the advantage of being very simple and extremely space-saving.

In the arrangements of FIGS. 15 and 16, the windings or winding groups 6, 6' 6" lie in different planes. This has the advantage of geometrical independence between the individual planes. In the arrangement of FIG. 15, the same design is provided in both planes; only a different drive is used. In the arrangement according to 16, the two planes are differently designed (configured) and also may have different conductor implementation (dimension, material). The manner of realizing switchable coil sets according to FIGS. 14 through 14 can, for example, be optionally utilized for the two coil sets 1 and 1' according to the exemplary embodiment of FIGS. 9 through 12. The design according to FIG. 16 corresponds to that of the coil set 1, 1' in FIGS. 11 and 12.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil arrangement for a magnetic resonance tomography apparatus, comprising:

a first set of windings comprising a plurality of individual windings disposed in at least a primary winding surface;

a second set of windings comprising a plurality of individual windings disposed in a secondary winding surface, said primary winding surface and said secondary winding surface being radially spaced from each other;

said primary winding surface and said secondary winding surface having an end face, and each of said individual windings in said first set of windings and each of said individual windings in said second set of windings having free conductor ends at said end face;

a plurality of connector elements for selectively connecting said free conductor ends in said primary winding surface to said free conductor ends in said secondary winding surface and for connecting free conductor ends within said primary winding surface to other free conductor ends within said primary winding surface and for connecting free conductor ends in said secondary winding surface to other free conductor ends in said secondary winding surface; and said connector elements being selectively connectable and disconnectable to said free conductor ends to switchably form a plurality of different combinations of individual windings in said first set of windings and individual windings in said second set of windings to form different gradient coil arrangements respectively having different field qualities and performance features.

2. A gradient coil arrangement as claimed in claim 1 wherein said first set of windings and said second set of windings have a further end face, opposite said end face, and have a further plurality of free conductor ends at said further end face, and wherein said gradient coil arrangement further comprises a further plurality of connector elements selectively connecting said further conductor ends in said primary winding surface to further conductor ends in said secondary winding surface and for connecting further conductor ends in said primary winding surface to other further conductor ends in said primary winding surface and for connecting further conductor ends within said secondary winding surface to other further conductor ends in said secondary winding surface.

3. A gradient coil arrangement as claimed in claim 1 wherein said primary winding surface has an interior, and wherein said switchable connector elements are disposed at said interior.

4. A gradient coil arrangement as claimed in claim 1 wherein said first and second sets of windings form a wound coil region, and wherein said switchable connector elements are integrated in said wound coil region.

5. A gradient coil arrangement as claimed in claim 1 wherein at least one set of field qualities and performance features is selected prior to examining a subject with said gradient coil arrangement, and wherein said switchable connector elements are connected to said free conductor ends to produce said set of field qualities and performance features.

6. A gradient coil arrangement as claimed in claim 1 wherein said switchable connector elements are electronic elements, and wherein said connector elements are switched in a program-controlled manner.

7. A gradient coil arrangement as claimed in claim 1 wherein said first and second sets of windings form two halves along a longitudinal direction of said first and second sets of windings, said two halves being asymmetrically interconnected by said switchable connector elements.

8. A gradient coil arrangement as claimed in claim 1 wherein said individual windings in each of said first and second sets of windings are respectively disposed in single winding surfaces.

9. A gradient coil arrangement as claimed in claim 1 wherein at least one of said first and second sets of individual windings comprises windings disposed in adjacent winding surfaces.

10. A gradient coil arrangement as claimed in claim 9 wherein the winding in the respectively different winding surfaces have different designs.

* * * * *